US006756847B2

(12) United States Patent
Blecker et al.

(10) Patent No.: US 6,756,847 B2
(45) Date of Patent: Jun. 29, 2004

(54) OPERATIONAL AMPLIFIER WITH INCREASED COMMON MODE INPUT RANGE

(75) Inventors: Eric B. Blecker, San Jose, CA (US); Sumant Ranganathan, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/373,576

(22) Filed: Feb. 26, 2003

(65) Prior Publication Data

US 2003/0222715 A1 Dec. 4, 2003

Related U.S. Application Data

(60) Provisional application No. 60/360,179, filed on Mar. 1, 2002.

(51) Int. Cl.[7] .................................................. H03F 3/45
(52) U.S. Cl. .......................... 330/253; 330/257; 330/258
(58) Field of Search ............................. 330/253, 257, 330/258

(56) References Cited

U.S. PATENT DOCUMENTS 4,345,213 A * 8/1982 Schade, Jr. ................. 330/253
5,808,513 A * 9/1998 Archer ........................ 330/253
6,559,720 B1 * 5/2003 Huijsing et al. ............. 330/253
6,563,381 B1 * 5/2003 Strong ........................ 330/253
6,657,486 B2 * 12/2003 Kimura ....................... 327/563

OTHER PUBLICATIONS

Paul R. Gray et al., *Analysis and Design of Analog Integrated Circuits*, 4th Edition, 2001, pp. 446–450.

* cited by examiner

*Primary Examiner*—Patricia Nguyen
(74) *Attorney, Agent, or Firm*—Sterne,Kessler,Goldstein & Fox PLLC

(57) ABSTRACT

An operational amplifier includes a first stage with a first differential transistor pair inputting a differential input signal at their gates, a first tail current source transistor connected to sources of the first differential transistor pair, and a load transistor pair connected in series with the drain of first differential transistor pair. An input stage includes a second differential transistor pair connected to respective drains of the first differential transistor pair at their gates, and a second tail current transistor connected to sources of the differential transistor pair. An output stage outputs a signal corresponding to the differential input signal.

24 Claims, 4 Drawing Sheets

OPERATIONAL AMPLIFIER WITH INCREASED COMMON MODE INPUT RANGE

CROSS-REFERENCE TO RELATED APPLICATIONS

This application claims priority to U.S. Provisional Patent Application No. 60/360,179, filed on Mar. 1, 2002, entitled "OPERATIONAL AMPLIFIER WITH INCREASED COMMON MODE USING THREE STAGES AND A SQUEEZABLE TAIL CURRENT SOURCE," which is incorporated by reference herein.

BACKGROUND OF THE INVENTION

1. Field of the Invention

The present invention relates to operational amplifiers, and more particularly, to operational amplifiers with increased common mode input range.

2. Related Art

Standard NTSC color video systems have been commonplace since 1970 and continue to be used widely today. The baseband NTSC video signal is an analog signal with an amplitude of approximately 1.3 Volt-peak-to-peak ($V_{pp}$) and has remained largely unchanged since the technology's inception. Early video systems had relatively large supply voltages where the difference in the positive and negative supply voltage would often be 30 volts. Processing a 1.3 $V_{pp}$ signal using analog circuits with 30 V across the supplies means that issues of headroom were rarely a problem. Problems with headroom occur when the input voltage comes too close to the circuit's power supply voltages such that the circuits cannot operate properly. Given a specific supply voltage, a common-mode input range (CMIR) is defined as the range of input voltages over which the circuit can operate correctly.

The desire to integrate many circuits, both analog and digital, onto a single IC means using CMOS technologies with very small geometries. As transistor sizes shrink, more circuits can be integrated using the same amount of silicon area. However, as the transistor size shrinks, so does the maximum voltage across which the devices can safely operate. As the supply voltage approaches the signal amplitude, the challenges in circuit design increase dramatically. The required CMIR may include much of the available supply voltage. Attenuation of the NTSC signal is usually undesirable, because the NTSC signal is single-ended, and such an attenuation will result in a serious noise problem.

Many operational amplifiers (op amps) use rail-to-rail circuit techniques which allows the CMIR to include the entire supply voltage. These topologies often employ two input stages, one for operation near each supply voltage. One input stage will use a PMOS differential pair and the other will use a NMOS differential pair. Because the transconductances of these two input pairs are not matched and will not track each other over process variations, the linearity of the overall amplifier is degraded, and high performance is difficult to achieve.

Another op amp topology often chosen for it's high CMIR is the folded-cascode topology (See "Analysis and Design of Analog Integrated Circuits", Gray, Hurst, Lewis & Meyer, John Wiley and Sons, $4^{th}$ ed. 2001, pp. 446–450). Defining the MOS threshold voltage as $V_t$ and the overdrive voltage $V_{GT}=V_{GS}-V_t$, in FIG. 6.28 of Gray et al., maximum input common-mode voltage $V_{CMI}(max)=V_{DD}-V_{t5}-V_{GT5}-V_{GT1}$ (assume matched transistor pairs M1–M2, M11–M12, M1A–M2A in FIG. 6.28 of Grey et al., with the numeric subscript referring to the transistor number). Also the $V_t$'s and $V_{GT}$'s are assumed to be positive whether the transistor is NMOS or PMOS. Voltages greater than $V_{CMI}(max)$ will cause M5 to leave saturation and it's current will drop. The folded-cascode circuit often allows the $V_{CMI}$ to reach the negative supply, usually ground in low supply voltage circuits, without any problems. However, in unity gain buffer configurations, where the inverting op amp input is tied to the output, it is the output which will limit the voltage swing.

Although the linearity of the folded-cascode op amp is better than the typical rail-to-rail designs, it still has linearity problems due to the finite output impedance of M5 in FIG. 6.28 of Gray et al. As the common mode input voltage $V_{CMI}$ changes, the tail current $I_{D5}$ will change, which will in turn change the gain of the stage. The stage gain varies as a function of the input stage transconductance $g_m$ times the output resistance $R_0$. The gain goes down as the tail current increases. To overcome this problem, the tail current source could be cascoded, however this would further reduce $V_{CMI}(max)$ by an additional $V_{GT}$ term.

BRIEF SUMMARY OF THE INVENTION

Accordingly, the present invention is directed to an operational amplifier with increased common mode input range that substantially obviates, one or more of the disadvantages of the related art.

There is provided an operational amplifier including a first stage with a first differential transistor pair receiving a differential input signal at their gates, a first tail current source transistor connected to sources of the first differential transistor pair, and a load transistor pair connected in series with drains of the first differential transistor pair. An input stage includes a second differential transistor pair connected to respective drains of the first differential transistor pair at their gates, and a second tail current transistor connected to sources of the differential transistor pair. An output stage outputs a signal corresponding to the differential input signal.

In another aspect there is provided an operational amplifier including a first stage inputting a differential input signal. An input stage includes a second differential transistor pair connected to the first stage, and a tail current transistor connected to sources of the differential transistor pair. An output stage outputs a signal corresponding to the differential input signal. The first stage expands a common mode input range of the input stage.

Additional features and advantages of the invention will be set forth in the description which follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

Figure 1:
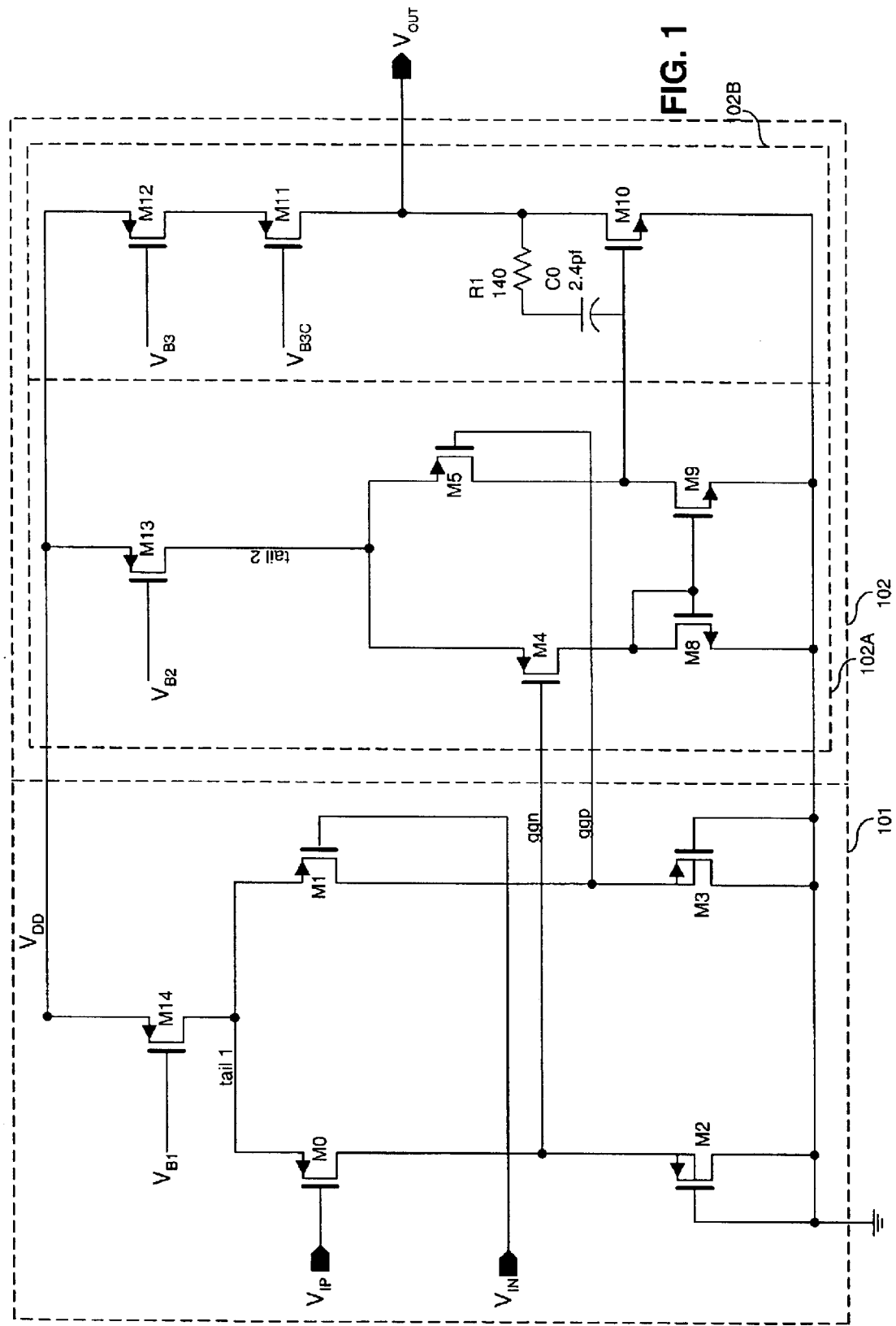
FIG. 1 illustrates a three-stage operational amplifier of one embodiment of the present invention.

FIG. 1 illustrates a three-stage amplifier of one embodiment of the present invention. As shown in FIG. 1, the amplifier includes a conventional 2-stage amplifier 102, and an added stage 101 (a "$g_m$-$g_m$ stage"). These stages will be referred to as conventional amplifier 102 and "first stage" 101 when referring to FIG. 1.

The amplifier 102 is well known in the art and includes two differential pair transistors M4, M5, NMOS transistor pair M8 and M9, a tail current transistor M13, and output stage M12, M11 and M10, outputting a signal $V_{OUT}$. Transistors M4, M5, M13, M12, M11 and M10 are PMOS transistors, and transistors M8 and M9 are NMOS transistors. Sources of transistors M8 and M9 are connected to ground. Drain of transistor M9 is connected to gate of transistor M10, and to output $V_{OUT}$ through capacitor C0 (2.4 pF) and resistor R1 (140 Ω). Transistors M4, M5, M8 and M9 collectively represent an example of an input stage 102A, and transistors M10, M11 and M12 is an example of an output stage 102B. In other words, amplifier 102 is a conventional 2-stage op amp.

In one embodiment, bias voltages $V_{B2}$, $V_{B3}$, $V_{B3C}$ are typically around 1.2–1.4 V. The supply voltage $V_{DD}$ is typically 2.5 V, but a variation of 10–15% is often seen, therefore, a nominally 2.5V circuit must operate down to 2.2V.

The gain of conventional amplifier stages varies with output voltage often resulting in distortion and nonlinearity. In practical video applications, it is desirable to have at least 10 bits of linearity, i.e., the circuit should be linear to one out of $2^{10}$, which corresponds to about 60 dB of linearity (1 bit=6 dB). It is more desirable to have at least 70 dB of linearity, which corresponds to 11–12 bits. It is also desirable to design a circuit using plain CMOS technology, and to have a circuit that has low power, low area, low noise, high linearity and high swing. Differential pair transistors M4 and M5 cannot accomplish it alone.

Adding a low-gain, high-bandwidth input stage to amplifier 102 will sacrifice some of its closed loop bandwidth. However it simplifies and improves many of the aspects of the op amp.

As further shown in FIG. 1, first stage 101 includes an input differential transistor pair M0 and M1, whose drains are connected to load transistors M2 and M3, respectively. Drains of transistors M2 and M3 are connected to ground, as are their gates. Substrates of transistors M2 and M3 are connected to their sources.

Figure 3:
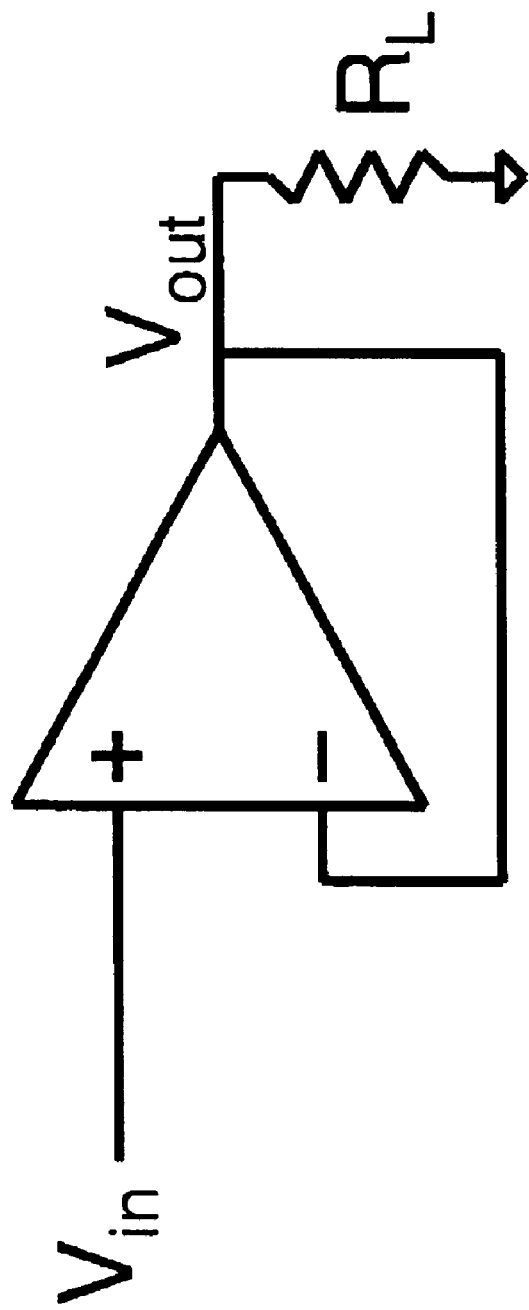
FIG. 3 illustrates a higher level schematic of the closed loop operational amplifier of FIGS. 1 and 2.

A tail current transistor M14 has a drain connected to sources of transistors M0 and M1 (at node tail1), and its source connected to the supply voltage $V_{DD}$. Transistor M14 has a gate voltage of $V_{B1}$ (a DC bias voltage), a gate of transistor M0 is driven by $V_{IP}$, and a gate of transistor M1 is driven by $V_{IN}$. In closed loop operation (see FIG. 3), $V_{IN}$ and $V_{OUT}$ would be connected to each other (not shown in FIG. 1). $V_{IN}$ and $V_{IP}$ correspond to the "−" and "+" inputs of an op amp (see FIG. 3).

Drains of M0 and M1 are also connected to gates of M4 and M5, respectively.

As the gain of first stage 101 is the ratio of the transconductances of transistors M0 and M2, $g_{M0}/g_{M2}$, this gain remains constant over variations in process temperature and bias because all the transistors are PMOS devices. The first stage 101 absorbs all the variation in $V_{CMI}$, therefore simplifying the design of amplifier 102 and allowing it to be optimized for high gain and low noise. In typical applications, the closed loop gain of the op amp of FIG. 1 is approximately 1, i.e., first stage 101 acts as a buffer stage. If the open loop gain of first stage 101 is 1.7, noise at the input is reduced by $1.7^2$, i.e., the proposed added stage results in a noise advantage.

The average voltage at nodes ggn and ggp does not change, i.e., it is fixed despite the swing in the input voltages $V_{IN}$ and $V_{IP}$. First stage 101 rejects the common mode voltage of signals applied at $V_{IP}$ and $V_{IN}$. Thus, wide input swings are absorbed by first stage 101. When input voltages at the gates of M0 and M1 swing towards negative supply, common mode input voltage into amplifier 102 is still fixed, since variation in the common mode input voltage is absorbed by first stage 101.

Note that tail current source transistor M14 may be replaced with an ideal current source.

Transistors M14, M0, M1, M2 and M3 are PMOS transistors in the circuit shown in FIG. 1. If the polarity of all transistors is reversed (i.e. all the NMOS transistors in FIG. 1 were replaced with PMOS transistors, and all the PMOS transistors were replaced with NMOS transistors), the circuit would work in the same manner. It is important, however, that M0 and M1 be of the same polarity (i.e., NMOS or PMOS), and M2 and M3 be of the same polarity. If control over manufacturing process parameters were such that threshold voltage, transconductance and body effect (i.e., body-source voltage or substrate-source voltage) were matched perfectly over the operating temperature range (in other words, the small signal model parameters of transistors M0–M3 were substantially identical), then differential transistor pair M0 and M1, and load transistor pair M2 and M3 need not be of the same polarity. However, to the extent the small signal model parameters of the four transistors M0–M3 are not perfectly matched, transistors M0–M3 need to be of the same polarity (all PMOS, or all NMOS).

As shown in FIG. 1, the $V_{CMI}$(max) of the circuit is similar to the folded cascode, though it does not require a cascoded tail current source for improved linearity resulting in lower power. Here, $V_{CMI}$(min)=$V_{t2}$+$V_{GT2}$−$V_{t0}$, (with the numeric subscript referring to the transistor number) which, assuming the $V_t$'s are equal, reduces to $V_{GT2}$. However, the body effect of MOS transistors will increase $V_t$ as the bulk-source voltage ($V_{BS}$) increases. This is used to some advantage in this topology. Tying the bulk (substrate) connection to the source of the load transistors M2, M3 means $V_{BS}$=0 and $V_t$ for the load transistors M2, M3 will not increase. Leaving the substrate of the input differential transistor pair M0, M1 tied to the positive supply $V_{DD}$ means that as $V_{CMI}$ decreases, $V_{t0}$ increases and $V_{CMI}$(min) is reduced, increasing the effective CMIR.

Due to the substrate-to-source connections of load transistors M2 and M3, the amplifier circuit gets an additional 100 millivolts of extra swing.

Figure 2:
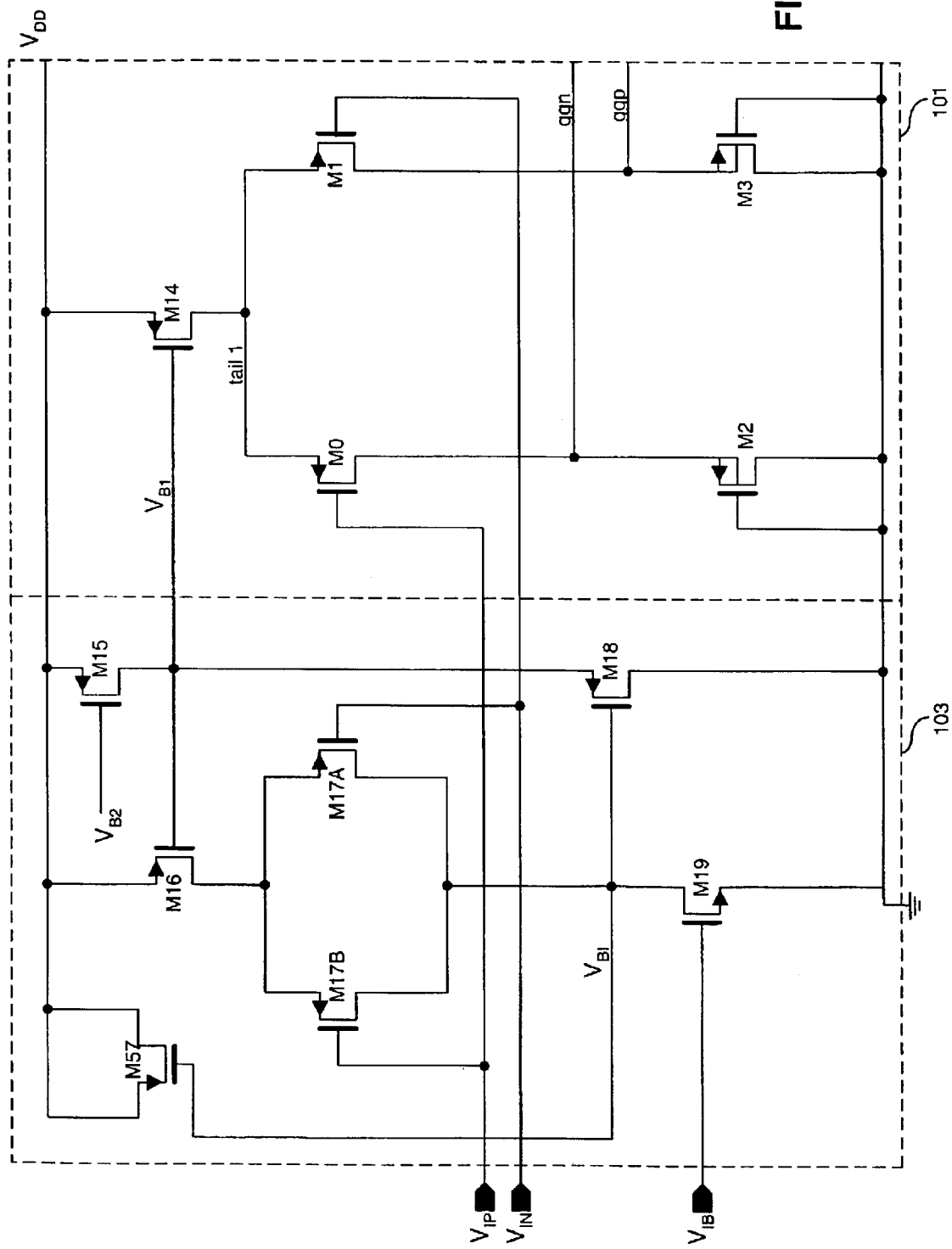
FIG. 2 illustrates an operational amplifier input stage biased by a squeezable tail current source of one embodiment of the present invention.

FIG. 2 illustrates a modification of the amplifier of FIG. 1, including the addition of a current source 103 (amplifier 102 is not shown for clarity). When $V_{IP}$ and $V_{IN}$ swing towards the $V_{DD}$ rail, transistor M14 leaves the saturation region and its current drops. This results in a reduction in the bandwidth, and to a second order gain, of first input stage 102, both of which cause nonlinearity. Accordingly, it is desirable to have transistor M14 go into a linear mode but still provide the same drain current to input into the differential transistor pair M0, M1. In other words, it is desirable to "squeeze" the drain-source voltage of transistor M14, i.e. to have it work outside of its saturation region, but still provide the same current as before.

As shown in FIG. 2, current source 103 includes PMOS transistors M15, M16, M17A, M17B, M18 and M57. Gates of transistors M17A and M17B are driven by $V_{IN}$ and $V_{IP}$, respectively. The source of transistor M15 is connected to the supply voltage $V_{DD}$, the gate of transistor M15 is driven by $V_{B2}$, and the drain of transistor M15 is connected to gates of transistors M16 and M14. The drain of transistor M15 is also connected to a source of transistor M18. The drain of transistor M18 is connected to ground. Transistors M17A and M17B form a differential pair, and drive NMOS transistor M19, and whose tail current source is transistor M16 (at node tail1b). Drains of transistors M17A, M17B are also connected to a gate of transistor M18. A gate of transistor M57 is connected to $V_{B1}$, and the gate of transistor M15 is driven by $V_{B2}$.

Transistors M16 and M14 form a current mirror, such that whatever current flows into M16 also flows into M14. If drain-source voltage $V_{DS}$ of transistor M14 is significantly different than $V_{DS}$ of transistor M16, and/or is less than $V_{GT}$, then current in the two transistors is no longer well matched. Therefore, two transistors M17A and M17B are used to remedy the situation. As the input voltages $V_{IN}$, $V_{IP}$ approach the supply voltage $V_{DD}$, and $V_{DS}$ of transistor M14 decreases, $V_{DS}$ of transistor M16 also decreases. As input voltages $V_{IN}$, $V_{IP}$ increase and begin to approach $V_{DD}$, the currents in transistors M16 and M14 remains the same for higher input voltages compared to without current source 103.

Transistor M15 provides a bias current to transistor M18, and can be replaced by an ideal current source, or by a resistor, as long as there is some current flowing.

Note that to be in a saturation region, transistor M14 needs to have at least $V_{GT}$ across the drain to source region (actually, slightly more than $V_{GT}$). In the circuit of FIG. 2, transistor M14 can still operate as a current source, but its drain source voltage $V_{DS}$ is less than $V_{GT}$. This occurs because input transistor M16 of the current source 103 has the same $V_{DS}$ as M14. The source voltages of M17A and M17B mimic the source voltages of the input devices, thus matching $V_{DS14}$ and $V_{DS16}$ equal. If both $V_{DS}$ and $V_{GS}$ of these devices match, the drain currents will be equal as well.

If transistor M14 in FIG. 1 were just a simple tail current source, $V_{CMI}$ (max) would be similar to the folded cascode topology. As shown in FIG. 2, transistors M14, M16 and M18 make a buffered simple current mirror with transistor M15 providing the bias for transistor M18. What makes current source transistor M16 squeezable is the two transistors M17A, M17B, each with a gate connected to each input of first stage 101. As $V_{CMI}$ increases and the input differential pair M0, M1 starts to squeeze M14 and push it into the linear region of operation, transistors M17A, M17B simultaneously squeeze transistor M16, doing the same to it. Because the current flowing out of transistor M19 does not change, neither can the drain currents of transistors M16, M17A and M17B, so transistor M16's gate voltage, labeled $V_{B1}$, adjusts to the appropriate value for the desired drain current in the linear region. Because $V_{B1}$ also drives the gate of transistor M14, the drain current of transistor M14 is largely unaffected when transistor M14 leaves the saturation region, unlike the simple current source in the folded-cascode topology. Without the squeezable tail, $V_{CMI}(\text{max})= V_{DD}-V_{r0}-V_{GT0}-V_{GT14}$. With the squeezable tail, the $V_{GT14}$ term is removed, and $V_{CMI}(\text{max})$ increases.

Note that current source 103 may be connected to the gate of M13 of amplifier 102, instead of the gate of transistor M14 of first stage 101. Even without first stage 101, the addition of current source 103 to "squeeze" transistor M13 will be advantageous. (Note that FIGS. 1 and 2 also show length and width dimensions of the various transistors of one exemplary implementation of the present invention.)

Figure 4:
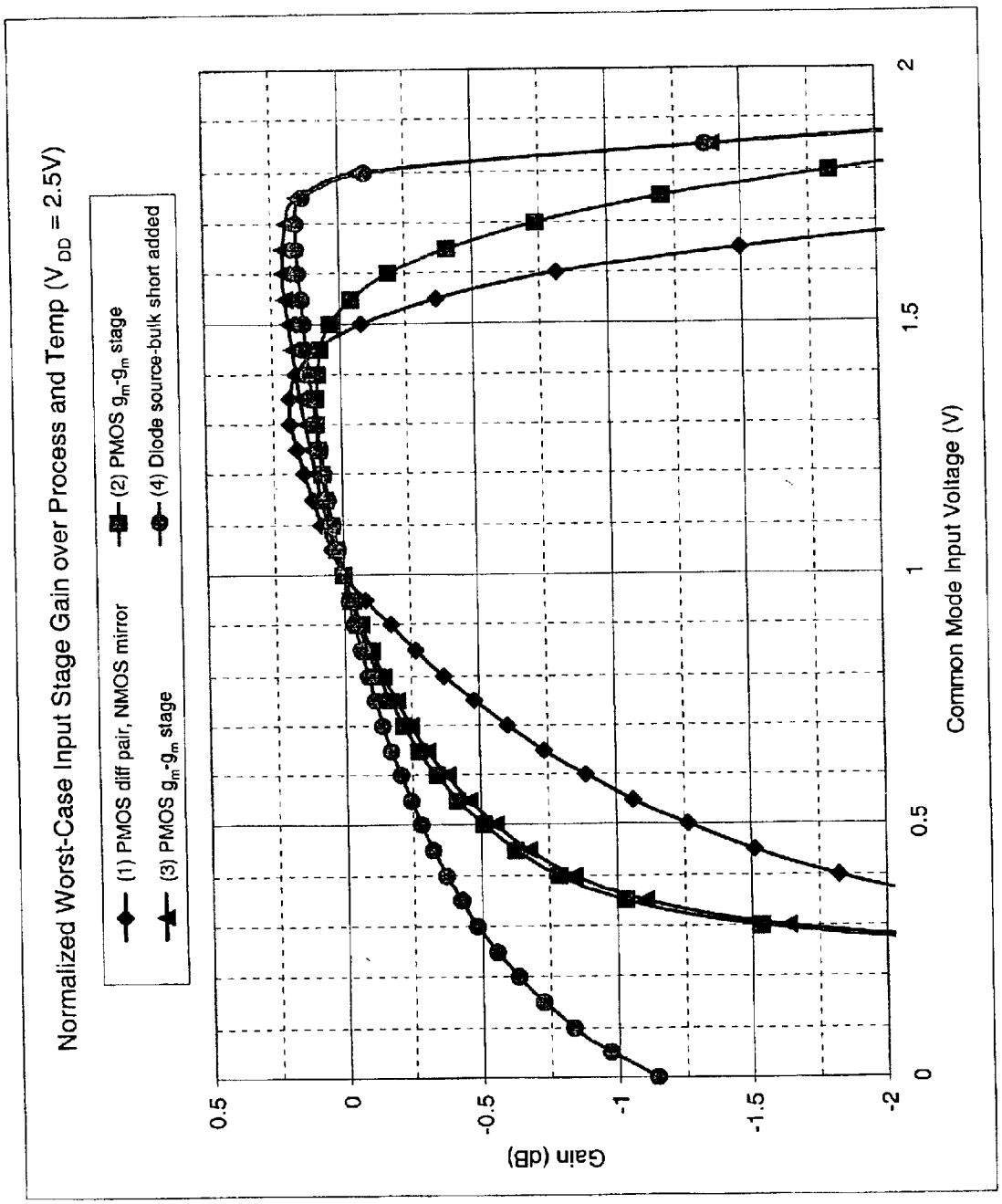
FIG. 4 illustrates a graph showing improvement in common mode input range using the present invention.

FIG. 4 illustrates the advantages of the present invention in graphical form by illustrating normalized worst-case input stage gain over all worst case process and temperature corners (for $V_{DD}$=2.5V).

There is no commonly accepted definition for an op amp's common mode-input range (CMIR) where high linearity will be obtained. What is usually specified is the minimum and maximum DC voltages which the amplifier can attain. However, signals may be distorted well before these voltages are reached. Over some CMIR, if an amplifier stage's gain remains constant at the signal frequency of interest, that stage will not contribute to an amplifier's overall distortion if the signal amplitude stays within the CMIR. FIG. 4 shows the worst case normalized input-stage gain as the common-mode input voltage $V_{CMI}$ is swept from 0 to 2 V. Normalized gain (meaning the gain at $V_{CMI}$=1V for each curve) was subtracted from the data so that all curves would cross a common point, and the changes in gain as a function of $V_{CMI}$ could be compared. "Worst-case" here means all combinations (16 total) of NMOS (high and low) transistors and PMOS (high and low) transistors, bias current (±20%) and operating temperature (0° C. and 125° C.) were simulated, and the curves shown in FIG. 4 are ones whose gain changed 1 dB most rapidly from the $V_{CMI}$=1V gain for both increasing and decreasing $V_{CMI}$. Each gain was determined in an AC small signal simulation and measured at the maximum NTSC signal frequency of 6 MHz.

The four curves represent four different amplifier circuits:

(1) No $g_m$-$g_m$ stage 101, amplifier 102 consisting of PMOS differential transistor pair M4–M5, NMOS transistors M8–M9 and current source M13 (in other words, the conventional amplifier 102 alone).

(2) Input stage PMOS $g_m$-$g_m$ stage 101 with a differential transistor pair M1–M2, diodes M3–M4 and a constant tail current source M14 is added. In this case, the gate of M14 is tied to a constant voltage reference and the body connections of the diode are tied to the positive supply.

(3) Squeezable current source 103, including transistors M15–M19, M57, is added to the circuit, compared to the circuit corresponding to the graph of (2).

(4) The bodies (substrates) of the diodes M3–M4 are tied to their respective sources, compared to the circuit corresponding to the graph of (3).

With each successive circuit change, the CMIR over which the gain remains relatively constant increases. This increases the range of $V_{CMI}$ that a signal may pass with little distortion.

Thus, the present invention provides an operational amplifier with a first stage that inputs a differential input signal and absorbing common mode variations in the differential input signal, and that outputs a first differential signal. The input stage includes a differential transistor pair receiving the first differential signal from the first stage. An output stage is connected to the input stage and outputs an amplified signal corresponding to the first differential signal.

The list below shows exemplary dimensions of one embodiment of the present invention:

M0 characteristics: w (width)=10 $\mu$m, l (length)=0.24 $\mu$m, m (multiplicity)=12
M1 characteristics: w=10 $\mu$m, l=0.24 $\mu$m, m=48
M2 characteristics: w=10 $\mu$m, l=0.24 $\mu$m, m=12
M3 characteristics: w=10 $\mu$m, l=0.24 $\mu$m, m=12
M4 characteristics: w=10 $\mu$m, l=0.24 $\mu$m, m=12
M5 characteristics: w=10 $\mu$m, l=0.24 $\mu$m, m=12
M8 characteristics: w=10 $\mu$m, l=0.4 $\mu$m, m=32
M9 characteristics: w=10 $\mu$m, l=0.4 $\mu$m, m=32
M10 characteristics: w=10 $\mu$m, l=0.24 $\mu$m, m=16
M11 characteristics: w=10 $\mu$m, l=0.24 $\mu$m, m=80
M12 characteristics: w=10 $\mu$m, l=0.48 $\mu$m, m=80
M13 characteristics: w=10 $\mu$m, l=0.5 $\mu$m, m=60
M14 characteristics: w=10 $\mu$m, l=0.24 $\mu$m, m=64
M15 characteristics: w=10 $\mu$m, l=0.6 $\mu$m, m=10
M16 characteristics: w=10 $\mu$m, l=0.24 $\mu$m, m=15
M17A characteristics: w=10 $\mu$m, l=0.24 $\mu$m, m=12
M17B characteristics: w=10 $\mu$m, l=0.24 $\mu$m, m=12
M18 characteristics: w=10 $\mu$m, l=0.24 $\mu$m, m=20
M19 characteristics: w=10 $\mu$m, l=1 $\mu$m, m=16
M57 characteristics: w=10 $\mu$m, l=2 $\mu$m, m=33

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An operational amplifier comprising:
    a first stage including:
        a first differential transistor pair receiving a differential input signal at their gates,
        a first tail current source transistor connected to sources of the first differential transistor pair, and
        a load transistor pair connected in series with drains of the first differential transistor pair;
    a second stage including a second differential transistor pair having gates connected to respective drains of the first differential transistor pair at their gates, and a second tail current transistor connected to sources of the second differential transistor pair; and
    an output stage outputting a signal corresponding to the differential input signal,
    wherein substrates of the load transistor pair are connected to their respective sources, and
    wherein the first stage expands a common mode input range of the operational amplifier.

2. The operational amplifier of claim 1, wherein transistors of the first differential pair are of the same polarity.

3. The operational amplifier of claim 1, wherein transistors of the load transistor pair are of the same polarity.

4. The operational amplifier of claim 1, wherein transistors of the first differential pair and transistors of the load transistor pair are all of the same polarity.

5. The operational amplifier of claim 1, wherein small signal model transconductance of transistors of the first differential pair and small signal model transconductance of transistors of the load transistor pair are substantially fixed relative to each other.

6. The operational amplifier of claim 1, wherein transistors of the first differential pair are PMOS transistors.

7. The operational amplifier of claim 1, wherein transistors of the load transistor pair are PMOS transistors.

8. The operational amplifier of claim 1, further including a current source connected to a gate of the first tail current source transistor that permits a squeezing of the first tail current source transistor.

9. The operational amplifier of claim 8, wherein the current source includes a third differential transistor pair whose gates are driven by the differential input signal.

10. An operational amplifier comprising:
    a first stage inputting a differential input signal;
    an input stage including a first differential transistor pair connected the first stage, and a first tail current source transistor connected to sources of the differential transistor pair; and
    an output stage outputting a signal corresponding to the differential input signal,
    wherein the first stage expands a common mode input range of the operational amplifier,
    wherein the first stage includes:
        a second differential transistor pair;
        a second tail current source transistor connected to sources of the second differential transistor pair; and
        a load transistor pair connected in series with drains of the second differential transistor pair, and
    wherein substrates of the load transistor pair are connected to their respective sources.

11. The operational amplifier of claim 10, wherein transistors of the second differential pair are of the same polarity.

12. The operational amplifier of claim 10, wherein transistors of the load transistor pair are of the same polarity.

13. The operational amplifier of claim 10, wherein transistors of the second differential pair and transistors of the load transistor pair are all of the same polarity.

14. The operational amplifier of claim 10, wherein small signal model transconductance of transistors of the first differential pair and small signal model transconductance of transistors of the load transistor pair are substantially fixed relative to each other.

15. The operational amplifier of claim 10, wherein transistors of the second differential pair are PMOS transistors.

16. The operational amplifier of claim 10, wherein transistors of the load transistor pair are PMOS transistors.

17. The operational amplifier of claim 10, further including an amplifier that extends a normal range of operation of the second tail current source transistor.

18. The operational amplifier of claim 17, wherein the current source includes a third differential transistor pair whose gates are driven by the differential input signal.

19. The operational amplifier of claim 10, wherein the first stage includes:
    a second differential transistor pair;
    a current source connected to sources of the second differential transistor pair; and
    a load transistor pair connected in series with the second differential transistor pair.

20. An operational amplifier comprising:

a first stage receiving a differential input signal;

means for inputting an input signal to a differential transistor pair;

means for outputting an amplified signal corresponding to the input signal; and means for expanding a common mode input range of the means for inputting and the means for outputting, the means for expanding connected to the means for inputting, wherein a gain of the first stage is substantially constant within the common mode input range.

21. An operational amplifier comprising:

a first stage inputting an input signal and absorbing common mode variations in the input signal, and outputting a first differential signal;

an input stage including a differential transistor pair receiving the first differential signal from the first stage; and an output stage connected to the input stage and outputting an amplified signal corresponding to the first differential signal, wherein a gain of the first stage is substantially constant within the common mode input range.

22. An operational amplifier comprising:

a first stage inputting a first differential input signal and outputting a second differential signal;

an input stage including a differential transistor pair receiving the second differential signal from the first stage; and an output stage connected to the input stage and outputting an amplified signal corresponding to the second differential signal, wherein a common mode input range of the operational amplifier is larger than a common mode input range of the input stage and output stage alone, wherein a gain of the first stage is substantially constant within the common mode input range.

23. An operational amplifier comprising:

an input stage including:
 a differential transistor pair inputting a differential input signal at their gates,
 a tail current source transistor connected to sources of the differential transistor pair, and
 a load transistor pair connected in series with drains of the differential transistor pair;

an amplifier connected to a gate of the tail current source transistor that permits the tail current source transistor to be squeezed; and an output stage outputting a signal corresponding to the differential input signal.

24. An operational amplifier comprising:

means for inputting an input signal to a differential transistor pair, the means for inputting including:
 a tail current source transistor connected to sources of the differential transistor pair;
 means for squeezing the tail current source transistor;

means for outputting an amplified signal corresponding to the input signal; and means for expanding a common mode input range of the input stage and the output stage, the means for expanding connected to the means for inputting, wherein a gain of the means for expanding and means for squeezing is substantially constant within the common mode input range.

* * * * *